US012266407B2

(12) United States Patent
Tanaka et al.

(10) Patent No.: US 12,266,407 B2
(45) Date of Patent: Apr. 1, 2025

(54) CONDITIONAL VALLEY TRACKING DURING CORRECTIVE READS

(71) Applicant: Micron Technology, Inc., Boise, ID (US)

(72) Inventors: Tomoharu Tanaka, Kanagawa (JP); James Fitzpatrick, Laguna Niguel, CA (US); Huai-Yuan Tseng, San Ramon, CA (US); Kishore Kumar Muchherla, San Jose, CA (US); Eric N. Lee, San Jose, CA (US); David Scott Ebsen, Minnetonka, MN (US); Dung Viet Nguyen, San Jose, CA (US); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 18/135,915

(22) Filed: Apr. 18, 2023

(65) Prior Publication Data

US 2023/0335201 A1    Oct. 19, 2023

Related U.S. Application Data

(60) Provisional application No. 63/332,401, filed on Apr. 19, 2022.

(51) Int. Cl.
*G11C 7/00* (2006.01)
*G11C 16/08* (2006.01)
*G11C 16/10* (2006.01)
*G11C 16/26* (2006.01)

(52) U.S. Cl.
CPC .............. *G11C 16/26* (2013.01); *G11C 16/08* (2013.01); *G11C 16/102* (2013.01)

(58) Field of Classification Search
CPC ........ G11C 7/1051; G11C 7/22; G11C 7/1072; G11C 7/1066
USPC ........................................ 365/189.14, 189.15
See application file for complete search history.

(56) References Cited

U.S. PATENT DOCUMENTS

2022/0043596 A1* 2/2022 Madraswala ........ G11C 29/021

* cited by examiner

*Primary Examiner* — Son T Dinh
(74) *Attorney, Agent, or Firm* — Lowenstein Sandler LLP

(57) ABSTRACT

A method includes causing a read operation to be initiated with respect to a set of target cells. For each target cell, a respective group of adjacent cells is adjacent to the target cell. The method further includes obtaining, for each group of adjacent cells, respective cell state information, assigning, based on the cell state information, each target cell of the set of target cells to a respective state information bin, and determining a set of calibrated read level offsets. Each state information bin is associated with a respective group of target cells of the set of target cells, and each calibrated read level offset of the set of calibrated read level offsets is associated with a respective state information bin of the set of state information bins.

20 Claims, 10 Drawing Sheets

CONDITIONAL VALLEY TRACKING DURING CORRECTIVE READS

RELATED APPLICATION

This application claims the benefit of U.S. Provisional Application 63/332,401, filed on Apr. 19, 2022 and entitled "CONDITIONAL VALLEY TRACKING DURING CORRECTIVE READS", the entire contents of which are incorporated by reference herein.

TECHNICAL FIELD

Embodiments of the disclosure relate generally to memory sub-systems, and more specifically, relate to conditional valley tracking during corrective reads.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
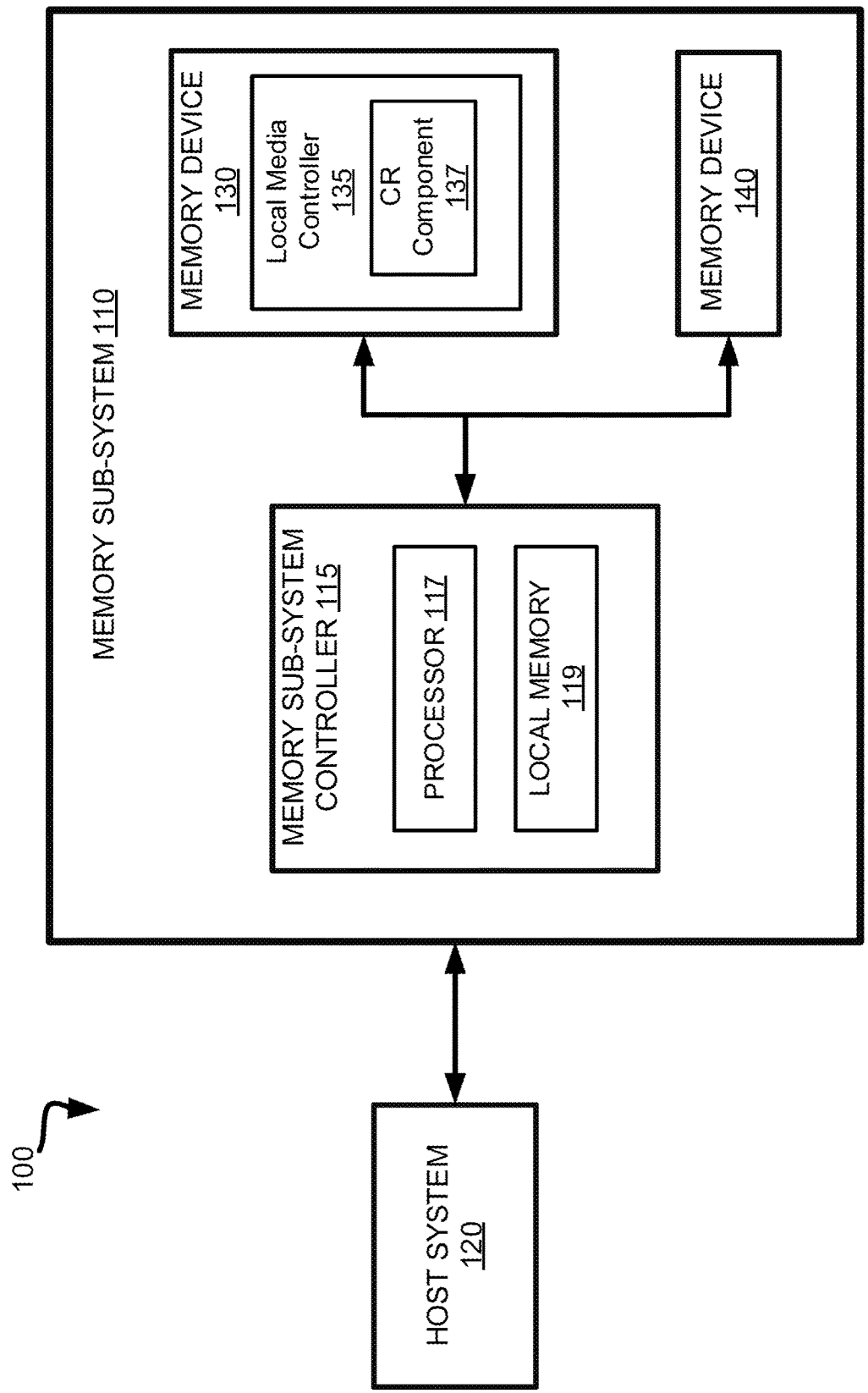
FIG. 1A illustrates an example computing system that includes a memory sub-system, in accordance with some embodiments of the present disclosure.

Aspects of the present disclosure are directed to conditional valley tracking during corrective reads. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. Memory cells are formed onto a silicon wafer in an array of columns and rows. A memory device can further include conductive lines connected to respective ones of the memory cells, referred to as wordlines and bitlines. A wordline can refer to one or more rows of memory cells of the memory device and a bitline can refer to one or more columns of memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g. oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T) = dW/dV_T$, where dW represents the probability that any given cell has its threshold voltage within the interval $[V_T, V_T + dV_T]$ when charge Q is placed on the cell.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_t$ distributions. As another example, in an MLC cell, there are 3 read windows that exist with respect to the 4 $V_t$ distributions. As yet another example, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

Cells of a memory array that are selected to be read during a read operation can be referred to target cells connected to a target wordline. The target cells can neighbor adjacent cells connected to at least one wordline neighboring the target wordline ("adjacent wordline"). For example, the at least one adjacent wordline can be a single wordline neighboring the target wordline or a pair of wordlines neighboring the target wordline. Illustratively, the target wordline can be referred to as an n-th wordline ($WL_n$), and the at least one adjacent wordline can include at least one of adjacent wordline n−1 ($WL_{n-1}$) or adjacent wordline n+1 ($WL_{n+1}$). For example, in a 3D memory device, the set of adjacent wordlines can include a wordline located directly above the target wordline and/or a wordline located directly below the target wordline.

Each target cell has a respective group of adjacent cells. Each group of adjacent cells includes at least one cell that neighbors its respective target cell (e.g., one cell connected to $WL_{n-1}$ and/or one cell connected to $WL_{n+1}$). More specifically, each target cell can be connected to the same bitline as each cell of the respective group of adjacent cells, such that the target cell and the cells of the respective group of adjacent cells are within the same string. Accordingly, each group of adjacent cells can include a single adjacent cell, or a pair of adjacent cells connected to a same bitline as a respective target cell.

A read can include a prologue phase during which a controller activates voltage pumps (e.g., causes voltage pumps to be turned on) and loads information for the read operation, a strobe phase in which a number of strobes are performed, and an epilogue phase during which the controller causes the cells to discharge, deactivates the voltage pumps (e.g., causes the voltage pumps to be turned off) and causes the memory device to return to an idle or standby state (e.g., depending on the state of the CE # signal). A strobe refers to a read performed at a particular read level offset (e.g., by applying the read level offset to a base read level). For example, for a 3 strobe page type, a 3 strobe read can be performed during the strobe phase.

Valley tracking is one mechanism that can be used by a controller to identify a calibrated read level for reading target cells connected to a target wordline. Valley tracking can be performed by analyzing $V_T$ distributions of a group of cells to obtain a model (e.g., histogram) describing the $V_T$ distributions, and identifying the calibrated read level from the model. For example, read level calibration can be performed by identifying a set of sample voltages about a chosen read level. Then, for each sample voltage of the set of sample voltages, the number of cells of the group that have a $V_T$ lower than the sample voltage is counted (e.g., in ascending order of voltages). The model (e.g., histogram) can be created using the cell counts (e.g., a histogram model), and the calibrated read level can be identified as the lowest or deepest point of the model. The calibrated read level identified using read level calibration can then be used to read the group of cells.

Illustratively, assume that read level calibration is being performed around a valley with respect to a particular $V_T$. The set of sample voltages can be defined within a voltage interval. A first cell count can be obtained by counting the number of cells of the group that have a $V_T$ lower than a first voltage within the voltage interval, a second cell count can be obtained by counting the number of cells of the group that have a $V_T$ lower than a second voltage within the voltage interval, . . . , and an n-th cell count can be obtained by counting the number of cells of the group that have a $V_T$ lower than an n-th voltage within the voltage interval. The valley can be modeled as a histogram created based on the n cell counts. If the cell counts with respect to and i-th and j-th voltage within the interval are determined to be the lowest, then the calibrated read voltage can be identified somewhere between the i-th and j-th voltage.

Cell-to-cell interference may exist in a memory array between the target cells and their respective groups of adjacent cells. Cell-to-cell interference can lead to lateral charge migration and $V_t$ distribution shift. Cell-to-cell interference, in addition to intrinsic charge loss, can further lead to a widening of $V_T$ distributions. The $V_T$ distribution widening can cause RWB degradation, which can negatively affect memory device reliability. For example, RWB degradation can lead to an increase in the number of errors (e.g., bit errors) and/or error rate (e.g., bit error rate (BER)).

One mechanism to compensate for the effects of cell-to-cell interference and/or intrinsic charge loss is corrective read. Generally, a corrective read operation is performed to read each target cell using an appropriate read level offset that accounts for the cell-to-cell inference, lateral charge migration and/or intrinsic charge loss caused by the respective group of adjacent cells. The read level offset can be applied with respect to a center read level. For example, the center read level can be located within a valley between target cell $V_T$ distributions.

To implement a corrective read operation, a controller can, for each group of adjacent cells, obtain cell state information for each cell of the group of adjacent cells. The cell state information for a cell reflects the logical level (e.g., L0-Ln, where n is the total number of logical levels supported) of the cell. For example, if a cell is an SLC cell, the cell state information can reflect whether the cell is in the L0 state or the L1 state. As another example, if the cell is a TLC cell, the cell state information can reflect which of the states L0-L7 that the cell is in. The cell state information for a cell can be obtained by identifying the state of the cell.

To identify the state of the cell, the controller can cause a read voltage to be applied the cell (e.g., gate electrode of the cell) and determine whether the read voltage activates (e.g., turns on) the cell. If the read voltage activates the cell, this indicates that the read voltage is greater than or equal to the $V_T$ of the cell. Additional read voltage(s) may be applied to the cell to determine whether the cell is in a lower state. If the read voltage does not activate the cell, this means that the read voltage is less than the $V_T$ of the cell, and that the cell is in a higher state. Additional read voltage(s) may be applied until the cell is activated. For each group of adjacent cells, the controller can store the cell state information for each cell of the group of adjacent cells in a respective page buffer (e.g., static page buffer). Each page buffer can be connected to a respective group of adjacent cells via a bitline.

In some embodiments, the cell state information for each cell of a group of adjacent cells is 1-bit information. For example, obtaining the 1-bit cell state information can involve applying a single strobe read to each cell of the group of adjacent cells. If the group of adjacent cells includes a single cell (e.g., a cell connected to one of the adjacent wordlines $WL_{n-1}$ and $WL_{n+1}$), then the stored cell state information is 1 bit in total. The 1-bit stored cell state information can be used to implement 1-bit corrective read (1BCR). If the group of adjacent cells includes a pair of cells (e.g., cells connected to the adjacent wordlines $WL_{n-1}$ and $WL_{n+1}$), then the stored cell state information is 2 bits in total. The 2 bit stored cell state information can be used to implement a "1-bit 2-sided" version of 2-bit corrective read (2BCR).

In some embodiments, the cell state information for each cell of a group of adjacent cells is 2-bit information. For example, obtaining the 2-bit cell state information can involve applying a three strobe read to each cell of the group of adjacent cells. If the group of adjacent cells includes a single adjacent cell (e.g., a cell connected to one of the adjacent wordlines $WL_{n-1}$ and $WL_{n+1}$), then the stored cell state information is 2 bits in total. The 2 bit stored cell state information can be used to implement a "2-bit 1-sided" version of 2BCR. If the group of adjacent cells includes a pair of cells (e.g., cells connected to the adjacent wordlines $WL_{n-1}$ and $WL_{n+1}$), then the stored cell state information is 4 bits in total. The 4 bit stored cell state information can be used to implement 4-bit corrective read (4BCR).

The controller can then assign each target cell to a respective state information bin ("bin") using the cell state information for each cell of the respective group of adjacent cells. As will be described in further detail below, each bin defines a respective cell state information condition, and a target cell is assigned to a bin if the cell(s) within its respective group of adjacent cells satisfy the cell state information condition for the bin. Thus, the bins divide each target cell $V_T$ distribution into a number of respective target cell $V_T$ sub-distributions, where each target cell $V_T$ sub-distribution is formed from the target cells assigned to a respective bin.

For example, assume that a group of adjacent cells for a target cell connected to $WL_n$ is a single adjacent cell connected to $WL_{n-1}$ or $WL_{n+1}$. The cell state information condition for a bin can define a range of states for single adjacent cells. A target cell can then be assigned to the bin if the cell state information for the single adjacent cell indicates that the state of the single adjacent cell falls within the range.

As another example, assume that a group of adjacent cells for a target cell connected to $WL_n$ is a pair of adjacent cells including a first adjacent cell connected to $WL_{n-1}$ and a second adjacent cell connected to $WL_{n+1}$. The cell state information condition for a bin can define a first range of states for first adjacent cells and a second range of states for second adjacent cells. The target cell can then be assigned to the bin if the cell state information for the first adjacent cell indicates that the state of the first adjacent cell falls within the first range and if the cell state information for the second adjacent cell indicates that that the state of the second adjacent cell falls within the second range.

The number of bins can be determined by the particular corrective read implementation (e.g., 1BCR, 2BCR or 4BCR). More specifically, the number of bins can be determined as $2^B$, where B equals the total number of bits of cell state information stored for a group of adjacent cells.

For example, in a 1BCR implementation in which B=1, the number of bins is 2 (i.e., $2^1$) and each bin defines a respective cell state information condition. Illustratively, for a QLC cell implementation in which there are 16 total possible states L0-L15, a target cell can be assigned to a first bin assigned with a first read level offset if its single adjacent cell is determined to have a state from L0-L7, and a target cell can be assigned to a second bin assigned with a second read level offset if its single adjacent cell is determined to have a state from L8-L15.

As another example, in a 2-bit 1-sided 2BCR implementation in which B=2, the number of bins is 4 (i.e., $2^2$) and each bin defines a respective cell state information condition. Illustratively, for the QLC cell implementation, a target cell can be assigned to a first bin assigned with a first read level offset if its single adjacent cell is determined to have a state from L0-L3, a target cell can be assigned to a second bin if its single adjacent cell is determined to have a state from L4-, a target cell can be assigned to a third bin if its single adjacent cell is determined to have a state from L8-L11, and a target cell can be assigned to a fourth bin if its single adjacent cell is determined to have a state from L12-L15.

As yet another example, in a 1-bit 2-sided 2BCR implementation in which B=2, the number of bins is 4 (i.e., $2^2$) and each bin defines a respective cell state information condition. Illustratively, for the QLC cell implementation, a target cell can be assigned to a first bin if the adjacent cell connected to adjacent wordline $WL_{n-1}$ and the adjacent cell connected to adjacent wordline $WL_{n+1}$ are each determined to have a state from L0-L7. A target cell can be assigned to a second bin if the adjacent cell connected to adjacent wordline $WL_{n-1}$ is determined to have a state from L0-L7 and the adjacent cell connected to adjacent wordline $WL_{n+1}$ is determined to have a state from L8-L15. A target cell can be assigned to a third bin if the adjacent cell connected to adjacent wordline $WL_{n-1}$ is determined to have a state from L8-L15 and the adjacent cell connected to adjacent wordline $WL_{n+1}$ is determined to have a state from L0-L7. A target cell can be assigned to a fourth bin if the adjacent cell connected to adjacent wordline $WL_{n-1}$ and the adjacent cell connected to adjacent wordline $WL_{n+1}$ are each determined to have a state from L8-L15.

As yet another example, in a 4BCR implementation in which B=4, the number of bins is 16 (i.e., $2^4$) and each bin defines a respective cell state information condition. Illustratively, for the QLC cell implementation, a target cell can be assigned to a first bin if the adjacent cell connected to adjacent wordline $WL_{n-1}$ and the adjacent cell connected to adjacent wordline $WL_{n+1}$ each have a state from L0-L3. A target cell can be assigned to a second bin if the adjacent cell connected to adjacent wordline $WL_{n-1}$ is determined to have a state from L0-L3 and the adjacent cell connected to adjacent wordline $WL_{n+1}$ is determined to have a state from L4-L7. A target cell can be assigned to a third bin if the adjacent cell connected to adjacent wordline $WL_{n-1}$ is determined to have a state L0-L3 and the adjacent cell connected to adjacent wordline $WL_{n+1}$ is determined to have a state from L8-L11. A target cell can be assigned to a fourth bin if the adjacent cell connected to adjacent wordline $WL_{n-1}$ is determined to have a state from L0-L3 and the adjacent cell connected to adjacent wordline $WL_{n+1}$ is determined to have a state from L12-L15. The remaining 1 two bins can be generated with other similar combinations of states.

Each bin is assigned a respective read level offset for reading the target cells assigned to the bin. Each read level offset accounts for the effect that the state of each cell of the group of adjacent cells has on the respective target cell. Typically, the read level offset assigned to a bin is empirically determined through observation or experimentation of the effect that adjacent cell(s) with varying states have on respective target cells. The bin assignments and corresponding read level offsets can be stored in a metadata area of the device. Accordingly, the bins and read level offset assignments can be pre-determined before assigning target cells to bins.

The controller can then cause the target cells to be read using respective read level offsets. For example, the controller can cause target cells of a first bin, which form a first target cell $V_T$ sub-distribution, to be read at a first read level. The first read level is determined by locating a center read level, and applying the read level offset assigned to the first bin to the center read level. The center read level can have a voltage magnitude located within the valley between a pair of target cell $V_T$ distributions, and the read level offset can adjust the center read level such that the first read level can have a voltage magnitude located in the valley to the left of the first target cell $V_T$ sub-distribution. The other target cells can be read similarly.

In some implementations, corrective read as described above can be performed using a set of fixed read level offsets. For example, each bin can be assigned a respective read level offset that is provided by a user. However, such read level offsets can eventually cause read failures over time due to the effects of cell-to-cell interference and lateral charge migration.

Aspects of the present disclosure address the above and other deficiencies by implementing conditional valley tracking during corrective read. Implementing conditional valley tracking during corrective read can be used to obtain a set of calibrated read level offsets for reading target cells. For example, after obtaining the cell state information with respect to each group of adjacent cells, each calibrated read level offset of the set of calibrated read level offsets can be obtained by performing valley tracking on a respective pair of $V_T$ sub-distributions. Each $V_T$ sub-distribution is defined by the target cells assigned to a respective bin.

To implement a corrective read operation as described herein, a controller can, for each group of adjacent cells, obtain cell state information for each cell of the group of adjacent cells. The cell state information can be stored in respective page buffers. In some embodiments, the cell state information is 1-bit information. For example, the 1-bit information for a group of adjacent cells can be a logical "0" indicative of at least one cell of the group of adjacent cells having a programmed state. As another example, the 1-bit information for a pair of adjacent cells can be a logical "1" indicative of each cell of the group of adjacent cells having an erased state. In some embodiments, the cell state information is 2-bit information. For example, the 2-bit information can be a logical "00" indicative of both of the adjacent cells having a programmed state. As another example, the 2-bit information can be a logical "01" or "10" indicative of one of the adjacent cells having a programmed state and the other of the adjacent cells having an erased state. As yet another example, the 2-bit information can be a logical "11" indicative of both of the adjacent cells having an erased state. In some embodiments, the cell state information is 4-bit information. For example, the 4-bit information can be indicative of an electron state for the pair of adjacent cells.

The controller can assign each target cell of the set of target cells to a respective state information bin ("bin"). As described above, each bin is assigned with a group of target cells each determined to be adjacent to a group of adjacent cells having the same cell state information. Each group of target cells assigned to a respective bin can define a respective pair of group $V_T$ distributions. The controller can then, for each bin, obtain a calibrated read level offset for reading the group of target cells assigned to the bin. More specifically, the controller can, for each group of target cells, use valley tracking to locate a respective calibrated read level offset within a valley between its respective pair of group $V_T$ distributions. The calibrated read level offsets collectively form a set of calibrated read level offsets. For example, in the 1-bit information embodiments, the programmed state group assigned to the program state bin and the erased state group assigned to the erased state bin can each define a respective pair of group $V_T$ distributions. Another example, in the 2-bit information embodiments, the programmed state group assigned to the program state bin, the non-erased state group assigned to the non-erased state bin and the erased state group assigned to the erased state bin can each define a respective pair of group $V_T$ distributions. The controller can then read each group of target cells using its respective calibrated read level offset.

As opposed to the predetermined read level offsets (e.g., empirically determined read level offsets) utilized in some implementations of corrective read, each calibrated read level offset described herein is obtained on-the-fly using valley tracking. Thus, the read level offsets can be more accurate and can result in improved read performance. Further details regarding implementing conditional valley tracking during corrective reads are described herein below with reference to FIGS. 1-7.

Advantages of the present disclosure include, but are not limited to, improved memory device performance and reliability. For example, calibrating read level offsets during corrective read can improve read accuracy, which reduces read errors and increases the life of a memory device.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement a corrective read (CR) component 137 that can perform conditional valley tracking during corrective reads. To perform conditional valley tracking during a corrective read, the CR component 137 can initiate a read operation with respect to a set of target cells connected to a target wordline. For example, the CR component 137 can initiate the read operation in response to receiving a request (e.g., read command) via the memory sub-system controller 115 to read the set of target cells.

The CR component 137 can obtain, for each target cell, cell state information for a respective group of adjacent cells. In some embodiments, each group of adjacent cells includes a single cell. In some embodiments, each group of adjacent cells includes a pair of cells. For example, if the memory device 130 is a 3D memory device, the group of adjacent cells can include a cell directly located above its target cell and and/or a cell located directly below its target cell. Each cell of the group of adjacent cells is connected to a respective wordline of a group of adjacent wordlines neighboring the target wordline. For example, if the memory device 130 is a 3D memory device, the group of adjacent wordlines can include a wordline located directly above the target wordline and/or a wordline located directly below the target wordline. The cell state information for each pair of adjacent cells can be stored in a respective page buffer. In some embodiments, the cell state information for a cell of a group of adjacent cells is a $V_T$ indicative of a state of the cell.

In some embodiments, the cell state information is 1-bit information. For example, 1-bit information can be a logical "0" indicative of at least one cell of the group of adjacent cells having a programmed state. As another example, the 1-bit information can be a logical "1" indicative of each cell of the group of adjacent cells having an erased state.

In some embodiments, the cell state information is 2-bit information. For example, the 2-bit information can be a logical "00" indicative of both cells of a pair of adjacent cells having a programmed state. As another example, the 2-bit information can be a logical "01" or "10" indicative of one cell of a pair of adjacent cells having a programmed state and the other cell of the pair of adjacent cells having an erased state. As yet another example, the 2-bit information can be a logical "11" indicative of both cell of the pair of adjacent cells having an erased state.

The CR component 137 can then assign each target cell to a respective state information bin ("bin") based on the cell state information. Each bin defines a respective cell state information condition, and a target cell is assigned to a bin if the cell(s) within its respective group of adjacent cells satisfy the cell state information condition for the bin. Thus, the bins divide the $V_T$ distribution defined by the set of target cells into a number of respective group $V_T$ distributions, where each group $V_T$ distribution is defined by a group target cells assigned to a respective bin.

In some embodiments, the cell state information for each group of adjacent cells includes 1-bit information (e.g., the group of adjacent cells includes a single cell having associated 1-bit information) and the set of bins includes two bins. In some embodiments, the cell state information includes 2-bit information (e.g., the group of adjacent cells includes a single cell having associated 2-bit information, or the group of adjacent cells includes a pair of cells each having associated 1-bit information) and the set of bins includes four bins. In some embodiments, the cell state information includes 4-bit information (e.g., the group of adjacent cells includes a pair of cells each having associated 2-bit information) and the set of bins includes sixteen bins.

For example, in the 1-bit information embodiments, a target cell can be assigned to a programmed state bin if the target cell is connected to a page buffer storing 1-bit information indicating that the target cell is adjacent to a group of adjacent cells in which at least one cell has a programmed state (e.g., logical "0"). In contrast, a target cell can be assigned to an erased state bin if the target cell is connected to a page buffer storing 1-bit information indicating that the target cell is adjacent to a group of adjacent cells in which each adjacent cell has an erased state (e.g., logical "1"). The target cells assigned to the programmed state bin can be referred to as a "programmed state group" and the target cells assigned to the erased state bin can be referred to as an "erased state group."

As another example, in the 2-bit information embodiments, a target cell can be assigned to a programmed state bin if the target cell is connected to a page buffer storing 2-bit information indicating that the target cell is adjacent to a pair of adjacent cells in which both cells have a programmed state (e.g., logical "00"). A target cell can be assigned to a non-erased state bin if the target cell is connected to a page buffer storing 2-bit information indicating that the target cell is adjacent to a pair of adjacent cells in which one cell has a programmed state and another cell has an erased state (e.g., logical "01" or logical "10"). A target cell can be assigned to an erased state bin if the target cell is connected to a page buffer storing 2-bit information indicating that the target cell is adjacent to a pair of adjacent cells in which both cells have an erased state (e.g., logical "11"). The target cells assigned to the programmed state bin can be referred to as a "programmed state group," the target cells assigned to the erased state bin can be referred to as an "erased state group," and the target cells assigned to the non-erased state bin can be referred to as a "non-erased state group."

The CR component 137 can then, for each bin, obtain a calibrated read level offset for reading the group of target cells assigned to the bin. More specifically, the CR component 137 can, for each group of target cells, use valley tracking to locate a respective calibrated read level offset within a valley between its respective pair of group $V_T$ distributions. The calibrated read level offsets collectively form a set of calibrated read level offsets. For example, in the 1-bit information embodiments, the programmed state group assigned to the program state bin and the erased state group assigned to the erased state bin can each define a respective pair of group $V_T$ distributions. Another example, in the 2-bit information embodiments, the programmed state group assigned to the program state bin, the non-erased state group assigned to the non-erased state bin and the erased state group assigned to the erased state bin can each define a respective pair of group $V_T$ distributions. The CR component 137 can then read each group of target cells using its respective calibrated read level offset. Further details regarding the operations of the CR component 137, including valley tracking, will be described below with reference to FIGS. 4-6.

Figure 1B:
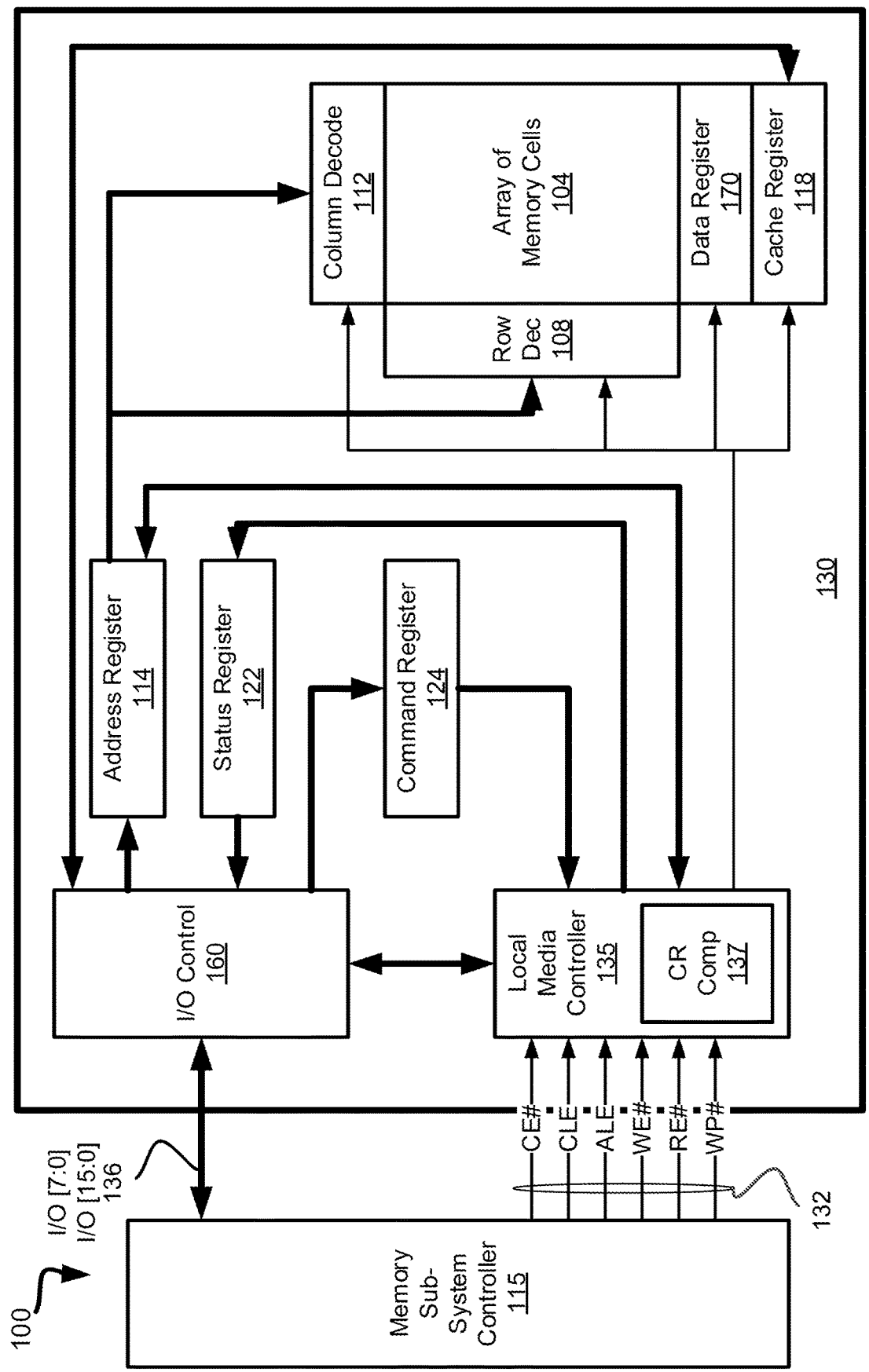
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 112 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 112 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 112 to control the row decode circuitry 108 and column decode circuitry 112 in response to the addresses. In one embodiment, local media controller 135 includes the CR component 137, which can implement the defect detection described herein during an erase operation on memory device 130.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
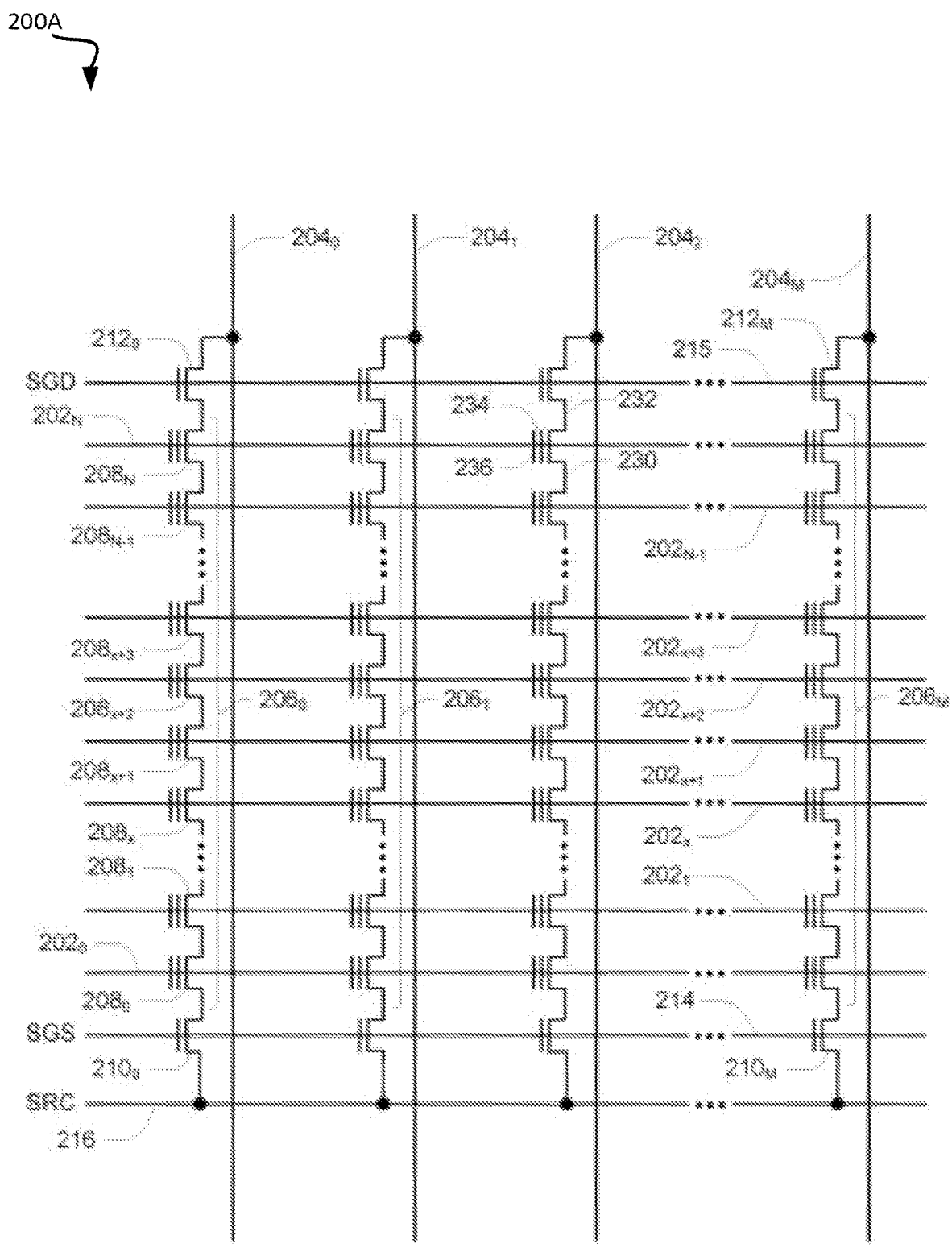
FIGS. 2A-2C are diagrams of portions of an example array of memory cells included in a memory device, in accordance with some embodiments of the present disclosure.
Figure 2B:
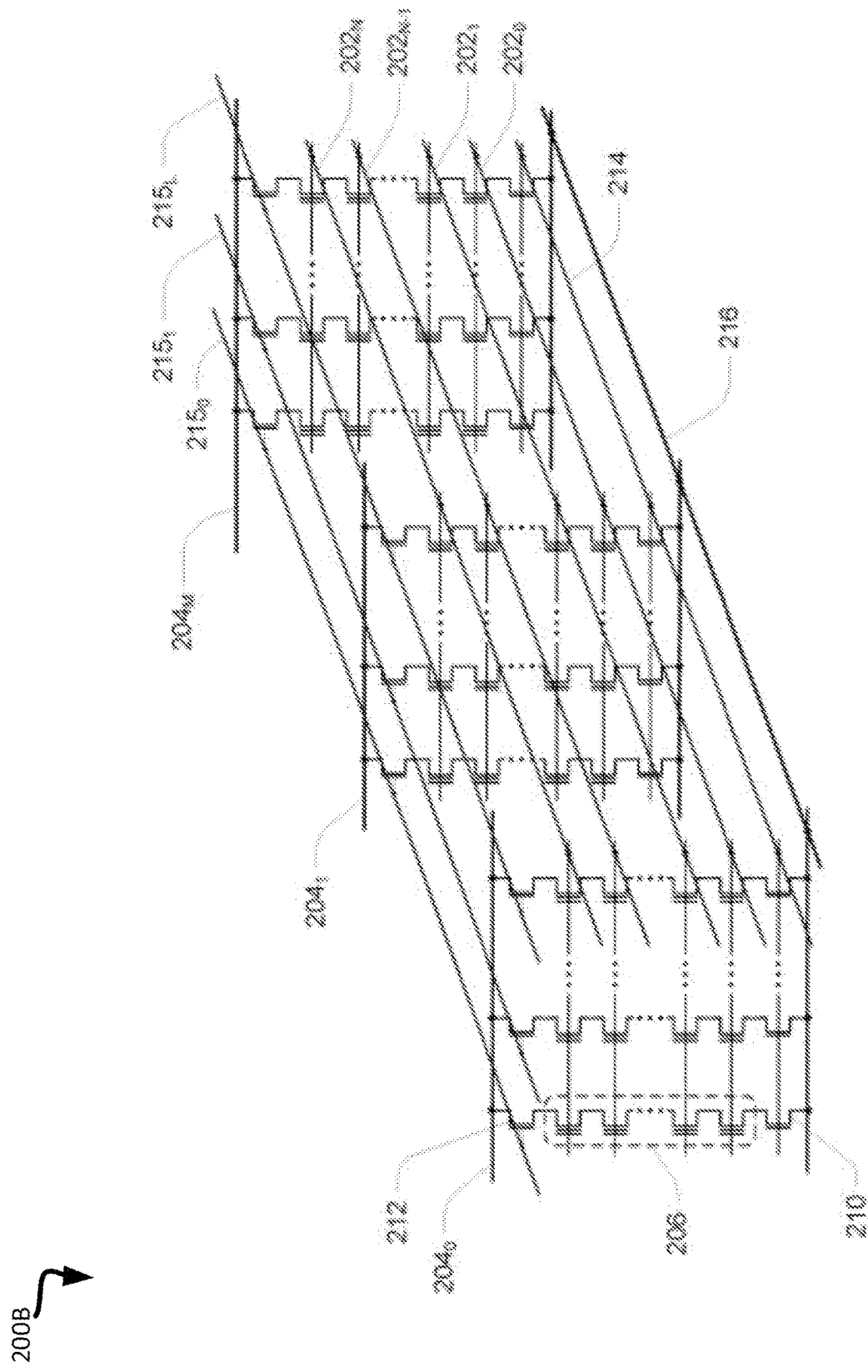
Figure 2C:
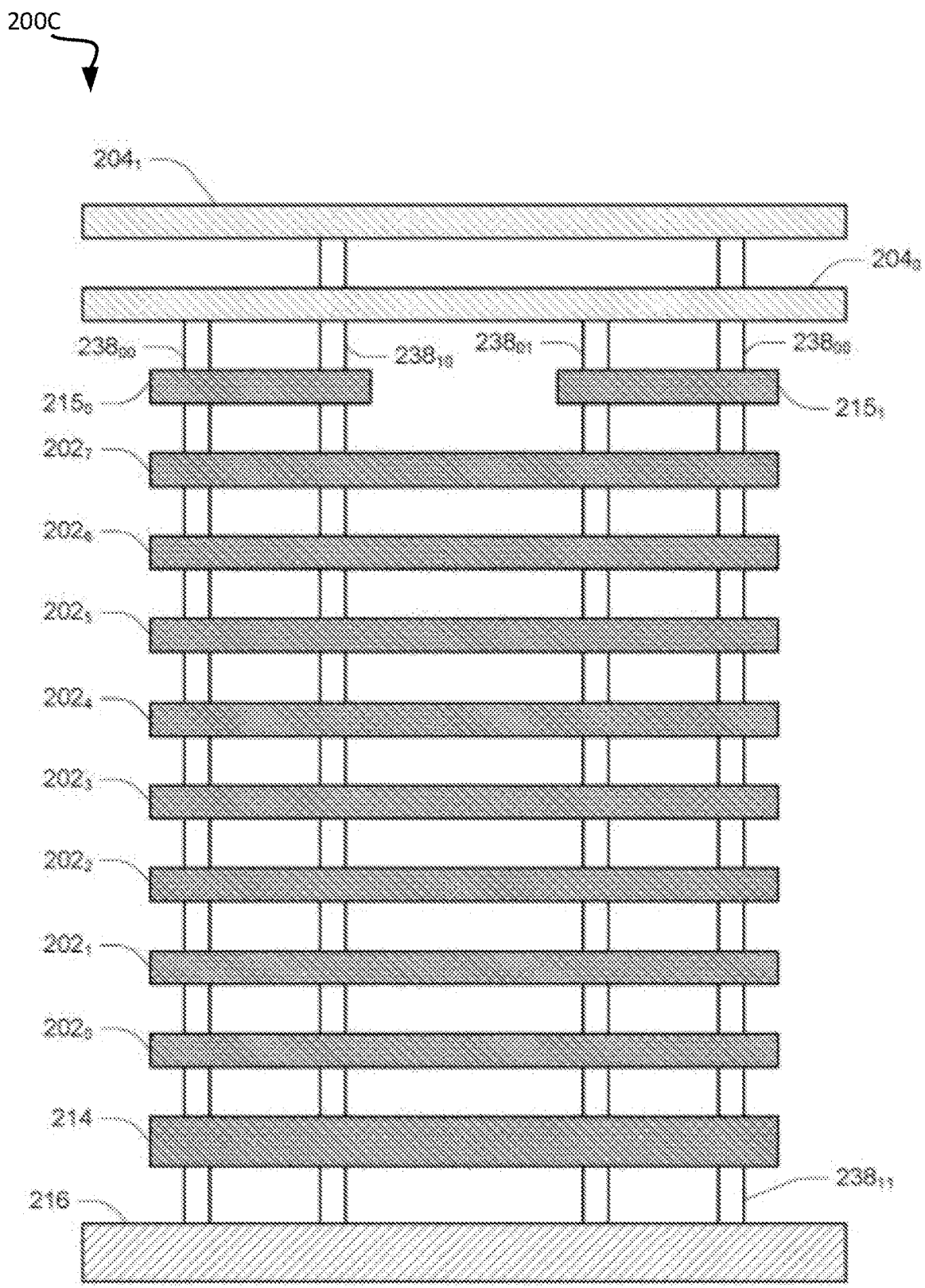

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Groups of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C is a diagram of a portion of an array of memory cells 200C (e.g., a portion of the array of memory cells 104). Channel regions (e.g., semiconductor pillars) $238_{00}$ and $238_{01}$ represent the channel regions of different strings of series-connected memory cells (e.g., strings 206 of FIGS. 2A-2B) selectively connected to the bitline $204_0$. Similarly, channel regions $238_{10}$ and $238_{11}$ represent the channel regions of different strings of series-connected memory cells (e.g., NAND strings 206 of FIGS. 2A-2B) selectively connected to the bitline $204_1$. A memory cell (not depicted in FIG. 2C) may be formed at each intersection of an wordline 202 and a channel region 238, and the memory cells corresponding to a single channel region 238 may collectively form a string of series-connected memory cells (e.g., a string 206 of FIGS. 2A-2B). Additional features might be common in such structures, such as dummy wordlines, segmented channel regions with interposed conductive regions, etc.

Figure 3:
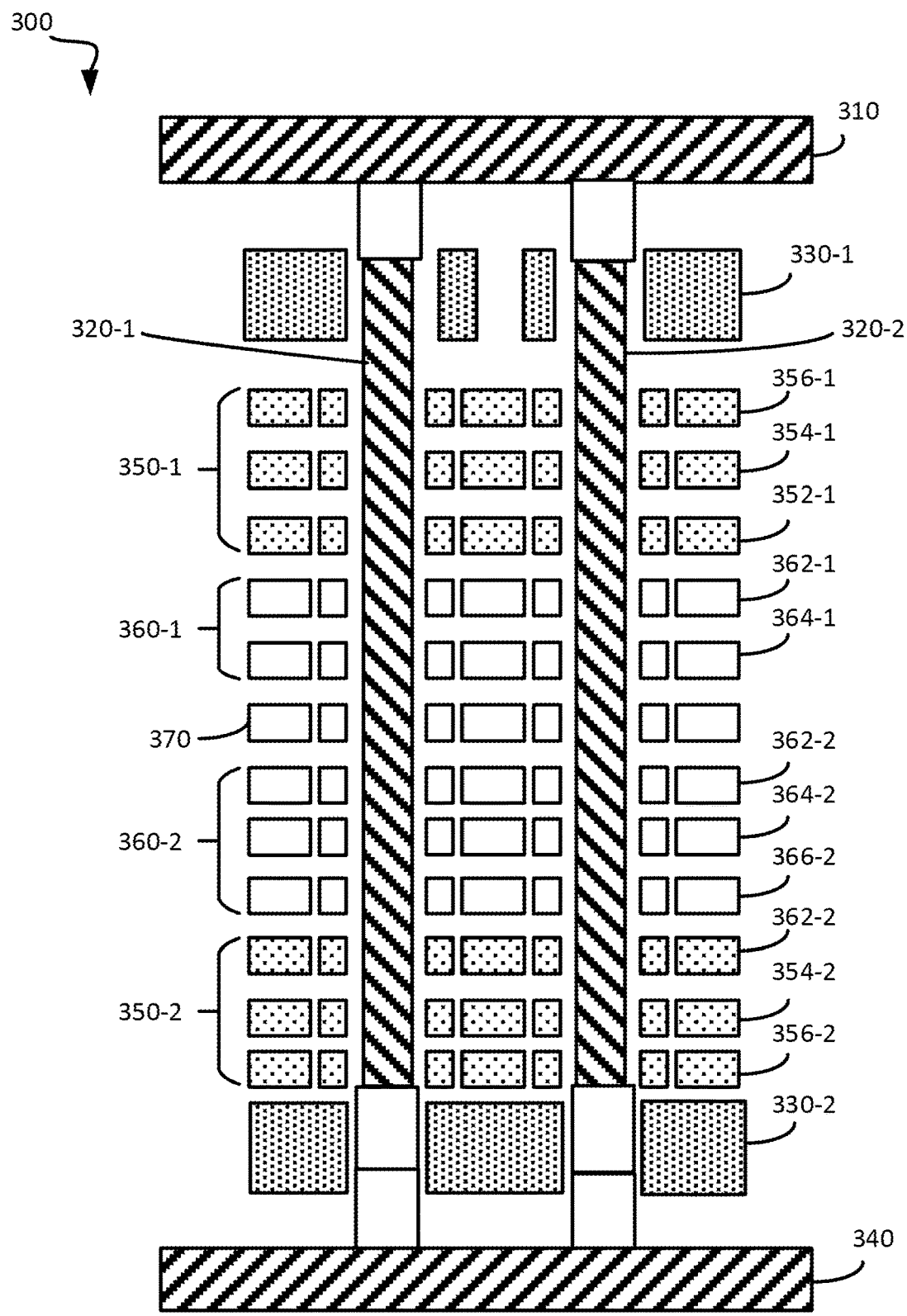
FIG. 3 is a diagram of an example three-dimensional (3D) replacement gate memory device that can enable performance of corrective reads implementing incremental reads, in accordance with some embodiments of the present disclosure.

FIG. 3 is a diagram of an example three-dimensional (3D) replacement gate memory device ("device") 300, in accordance with some embodiments of the present disclosure. However, the embodiments described herein can be applied to any suitable memory device. As shown, the device 300 includes a bitline 310, pillars 320-1 and 320-2, select gates (SGs) 330-1 and 330-2, a source line (SRC) 340, and WL groups 350-1, 350-2, 360-1 and 360-2. More specifically, WL groups 350-1 and 350-2 are dummy WL groups, and WL groups 360-1 and 360-2 are active WL groups. WL group 350-1 includes dummy WLs 352-1 through 366-1, WL group 650-2 includes dummy WLs 352-2 through 356-2, WL group 360-1 includes active WLs 362-1 and 364-1, and WL group 360-2 includes active WLs 362-2, 364-2 and 366-2. However, such an example should not be considered limiting. A dummy WL corresponds to memory cells that do not store data and are included to satisfy processing margins, while an active WL corresponds to memory cells that store data.

As further shown, a WL 370 is provided. In some embodiments, the device 300 is a multiple deck device, in which WL groups 350-1 and 360-1 are associated with a first deck (e.g., an upper deck) of the device 300 and the WL groups 350-2 and 360-2 are associated with a second deck (e.g., a lower deck) of the device 300, such that the WL 370 corresponds to a dummy WL separating the WL groups 360-1 and 360-2. In other embodiments, the device 300 is a "single deck" device, in which the WL groups 360-1 and 360-2 are not arranged in decks. Here, the WL 370 can be an active WL within one of the WL groups 360-1 or 360-2.

Figure 4:
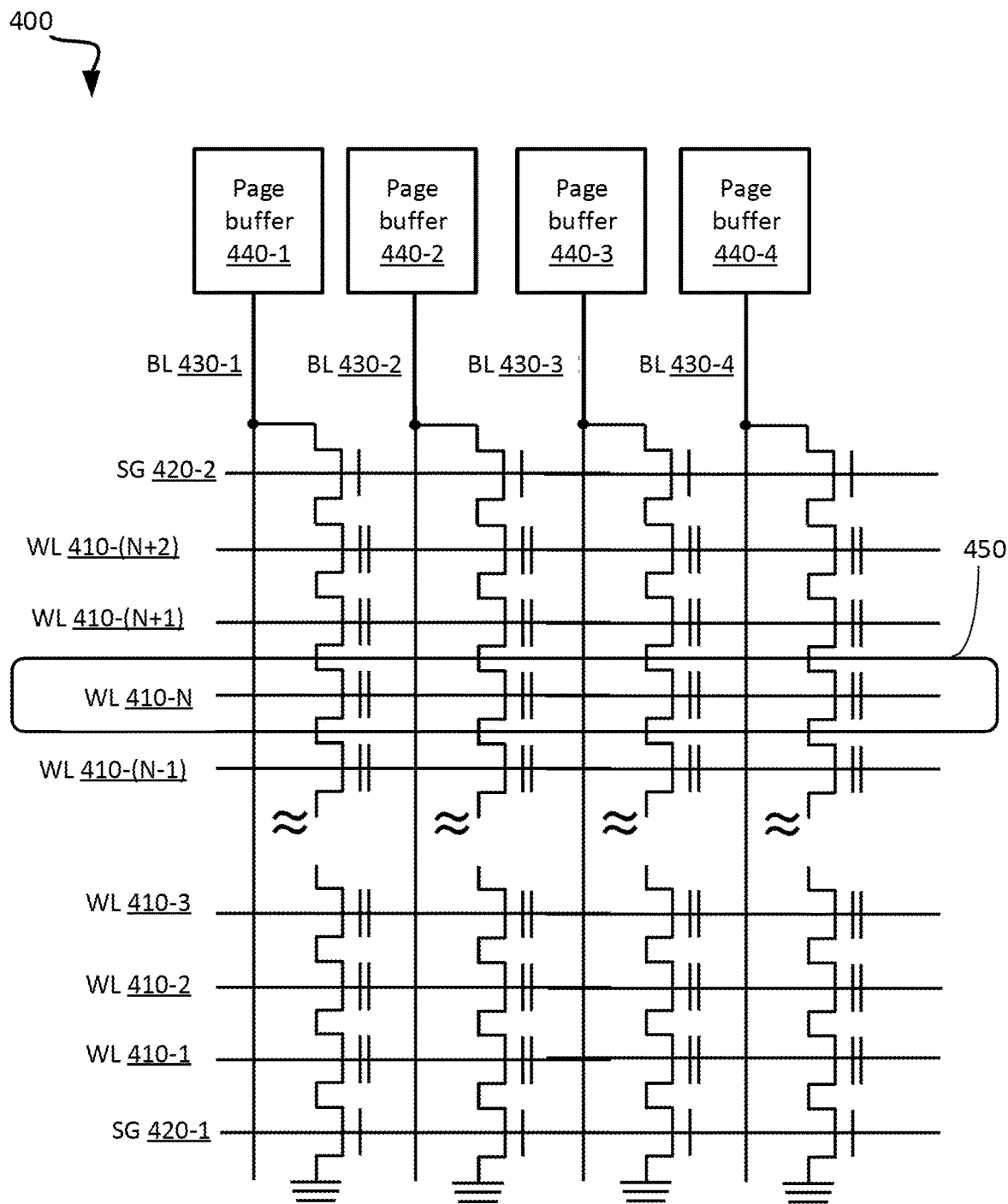
FIG. 4 is a diagram of a portion of a memory device, in accordance with some embodiments of the present disclosure.

FIG. 4 is a diagram of a portion of a memory array 400, in accordance with some embodiments. The memory array 400 can include any suitable number of wordlines (WLs). For example, as shown, the memory array 400 includes a number of wordlines WL 410-1 through WL 410-(N+2). Each of the WLs 410-1 through 410-(N+2) is connected to a respective set of cells. Each of the WLs 410-1 through 410-(N+2) is adjacent to at least one WL. For example, WL 410-(N+1) and WL 410-(N−1) are each adjacent wordlines with respect to WL 410-N. The memory array 400 further includes select gate (SG) 420-1 and SG 420-2. In some embodiments, SG 420-1 is a source-side SG (SGS) and SG 420-2 is a drain-side SG (SGD).

The memory array 400 further includes a number of bitlines (BLs) including BL 430-1 through 430-4 and a number of page buffers including page buffers 440-1 through 440-4. Each of the page buffers is connected to a respective one of the bitlines. Although only 4 bitlines 430-1 through 410-3 and page buffers 440-1 through 440-4 are shown, the memory array 400 can include any suitable number of bitlines and page buffers.

In this illustrative example, a set of target cells 450 is selected to be read. The set of target cells 450 includes a number of cells of the target wordline WL 410-N. Each target cell of the set of target cells 450 is adjacent to a pair of adjacent cells. More specifically, the pair of adjacent cells for a particular target cell includes the cell connected to WL 410-(N+1) that is directly above the target cell, and the cell connected to WL 410-(N−1) that is directly below the target cell. That is, a target cell of the set of target cells 450 is connected to a same one of the bitlines as its respective pair of adjacent cells.

A local media controller (e.g., local media controller 135 of FIGS. 1A-1B) can initiate a read operation with respect to the set of target cells 450. The local media controller can, for each target cell of the set of target cells 450, cause cell state information to be obtained for each cell of the respective group of adjacent cells. The cell state information for each cell can include a $V_T$ value indicative of the state of the cell (e.g., program state or erase state). For each cell of a group of adjacent cells, the cell state information can include a $V_T$ value indicative of a state of the cell.

In some embodiments, the cell state information for each group of adjacent cells is 1-bit information. For example, if each group of adjacent cells includes a single cell (e.g., a cell of WL 410-(N−1) or a cell of WL 410-(N+1)), then the cell state information for each group of adjacent cells can be 1-bit information obtained from the single cell. The local media controller can divide the set of target cells 450 into two bins. Each bin can be assigned target cells connected to an adjacent cell having 1-bit information determined to fall within a respective range of values. For example, assume that the 1-bit information for the single adjacent cell can fall into either a range A or a range B. Thus, each range defines a respective bin, namely bin A and bin B.

In some embodiments, the cell state information for each group of adjacent cells is 2-bit information. For example, if each group of adjacent cells includes a single cell (e.g., a cell of WL 410-(N−1) or a cell of WL 410-(N+1)), then the cell state information for each group of adjacent cells can be 2-bit information obtained from the single cell. The local media controller can divide the set of target cells 450 into four bins. Each bin can be assigned target cells connected to a group of adjacent cells having 2-bit information determined to fall within a respective range of values. For example, assume that the 2-bit information for a single cell can fall into range A, range B, range C or range D. Thus, each range defines a respective bin, namely bin A, bin B, bin C, bin D.

As another example, if each group of adjacent cells includes a pair of cells (e.g., a cell of WL 410-(N−1) and a cell of WL 410-(N+1)), then the cell state information for each group of adjacent cells can be 1-bit information obtained from each cell of the pair of cells. The local media controller can divide the set of target cells 450 into four bins. Each bin can be assigned target cells connected to a pair of adjacent cells having 2-bit information determined to fall within a respective combination of ranges of 1-bit information values. For example, assume that the 1-bit information for the cell of WL 410-(N−1) can fall into either a range A or a range B. Further assume that the 1-bit information for the cell of WL 410-(N+1) can fall into either a range 1 or a range 2. Thus, each combination of ranges defines a respective bin, namely bin A1, bin B1, bin A2, and bin B2.

In some embodiments, the cell state information for each group of adjacent cells is 4-bit information. For example, if each group of adjacent cells includes a pair of cells (e.g., a cell of WL 410-(N−1) or a cell of WL 410-(N+1)), then the cell state information for each group of cells can include 2-bit information obtained each cell of the pair of cells. The local media controller can divide the set of target cells 450 into sixteen bins. Each bin can be assigned target cells connected to a pair of adjacent cells having 4-bit information determined to fall within a respective combination of ranges of 2-bit information values. For example, assume that the 2-bit information for the cell of WL 410-(N−1) can fall into a range A, range B, range C or range D. Further assume that the 2-bit information for the cell of WL 410-(N+1) can fall into a range 1, a range 2, a range 3 or a range 4. Thus, each combination of ranges defines a respective bin, namely bin A1, bin B1, . . . , bin C4 and bin D4.

As an illustrative example, assume that the page buffer 440-1 stores 1-bit information indicating that at least one cell of its respective pair of adjacent cells has a programmed state ("0") (e.g., at least one of the cells of WL 410-(N−1) and at least one of the cells of WL 410-(N+1) connected to BL 430-1). Similarly, assume that page buffer 440-2 stores 1-bit information indicating that at least one cell of its respective pair of adjacent cells has the programmed state (e.g., at least one of the cells of WL 410-(N−1) and at least one of the cells of WL 410-(N+1) connected to BL 430-2). Further assume that page buffer 440-3 stores 1-bit information indicating that both cells of its respective pair of adjacent cells have an erased state ("1") (e.g., the cells of WL 410-(N−1) and the cells of WL 410-(N+1) connected to BL 430-3). Similarly assume that page buffer 440-4 stores 1-bit information indicating that both cells of its respective pairs of adjacent cells have the erased state (e.g., the cells of WL 410-(N−1) and the cells of WL 410-(N+1) connected to BL 430-4). In this example, the programmed state group can include the target cells of the set of target cells 450 that are connected to BL 430-1 and BL 430-2. The erased state group can include the target cells of the set of target cells 450 that are connected to BL 430-3 and BL 430-4.

The local media controller can then obtain a calibrated read level offset for the programmed state group and a calibrated read level offset for the erased state group. For example, for the programmed state group, the local media controller can use valley tracking to locate the calibrated read level offset within a valley between the pair of group $V_T$ distributions defined by the programmed state group. For the erased state group, the local media controller can use valley tracking to locate the calibrated read level offset within a valley between the pair of group $V_T$ distributions defined by the erased state group. The local media controller can then read the programmed state group and the erased state group using their respective calibrated read level offsets.

As another illustrative example, assume that page buffer 440-1 stores 2-bit information indicating that both cells of its respective pair of adjacent cells have a programmed state ("00") (e.g., the cells of WL 410-(N−1) and the cells of WL 410-(N+1) connected to BL 430-1). Similarly assume that page buffer 440-1 stores 2-bit information indicating that both cells of its respective pair of adjacent cells have the programmed state (e.g., the cells of WL 410-(N−1) and the cells of WL 410-(N+1) connected to BL 430-2). Further assume that the page buffer 440-3 stores 2-bit information indicating that one cell of its respective pair of adjacent cells has a programmed state ("0") (e.g., the cell of WL 410-(N−1) or the cell of WL 410-(N+1) connected to BL 430-3) and the other cell of its respective pair of adjacent cells has an erased state ("1") (e.g., the cell of WL 410-(N+1) or the cell of WL 410-(N−1) connected to BL 430-3). Thus, the pair of adjacent cells connected to BL 430-3 has a non-erased state (e.g., "01"). Moreover, assume that page buffer 440-4 stores 2-bit information indicating that both cells of its respective pair of adjacent cells have an erased state ("11") (e.g., the cells of WL 410-(N−1) and the cells of WL 410-(N+1) connected to BL 430-4). In this example, the programmed state group can include the target cells of the set of target cells 450 that are connected to BL 430-1 and BL 430-2. The non-erased state group can include the target cell of the set of target cells 450 that is connected to BL 430-3. The erased state group can include the target cell of the set of target cells 450 that is connected to BL 430-4.

The local media controller can then obtain a calibrated read level offset for the programmed state group, a calibrated read level of the non-erased state group, and a calibrated read level offset for the erased state group. For example, for the programmed state group, the local media controller can use valley tracking to locate the calibrated read level offset within a valley between the pair of group $V_T$ distributions defined by the programmed state group. For the non-erased state group, the local media controller can use valley tracking to locate the calibrated read level offset within a valley between the pair of group $V_T$ distributions defined by the non-erased state group. For the erased state group, the local media controller can use valley tracking to locate the calibrated read level offset within a valley between the pair of group $V_T$ distributions defined by the erased state group. The local media controller can then read the programmed state group, the non-erased state group and the erased state group using their respective calibrated read level offsets. Further details regarding performing conditional valley tracking during corrective reads are described above with reference to FIG. 1A and will be described in further detail below with reference to FIGS. 5A-6.

Figure 5A:
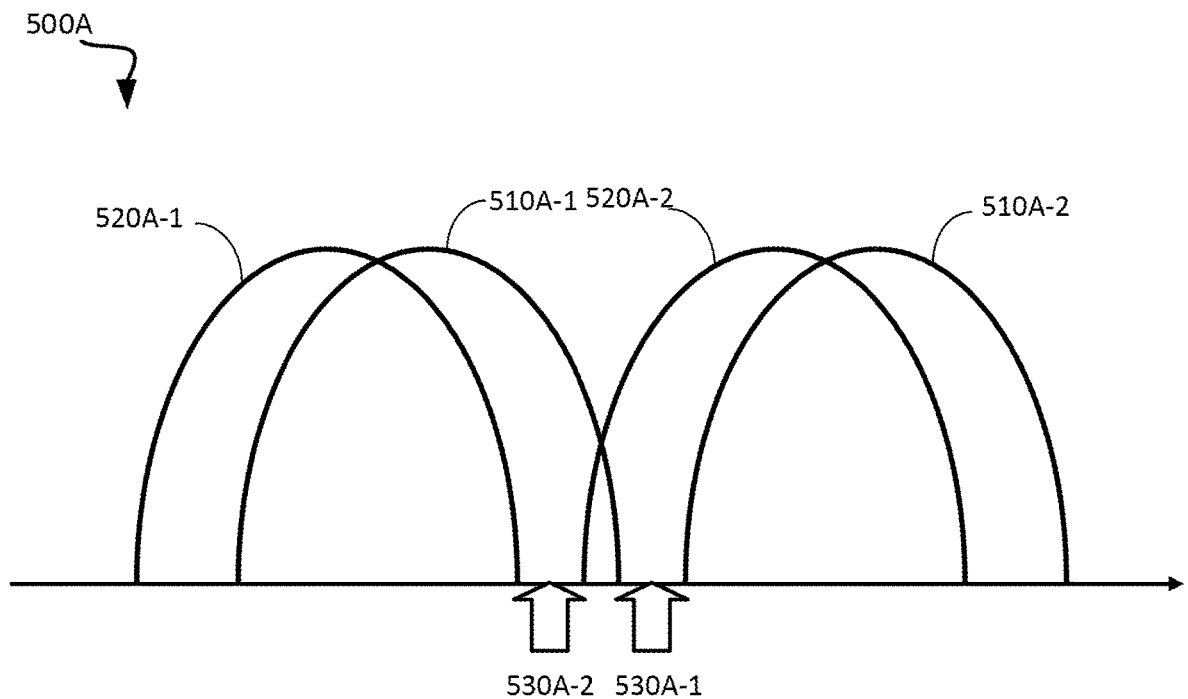
FIGS. 5A-5B are diagrams illustrating examples of conditional valley tracking during a corrective read, in accordance with some embodiments of the present disclosure.

FIG. 5A is a diagram 500A illustrating an example of conditional valley tracking during a corrective read, in accordance with some embodiments of the present disclosure. More specifically, diagram 500A illustrates conditional valley tracking performed utilizing 1-bit information indicative of a state of adjacent cells. A local media controller (e.g., local media controller 135 of FIGS. 1A-1B) can, using the 1-bit information, divide a set of target cells into a programmed state group assigned to a first bin and an erased state group assigned to a second bin. For example, a target cell can be assigned to the first bin if the target cell is determined to be adjacent to a pair of adjacent cells in which at least one adjacent cell has a programmed state (e.g., logical "0"). In contrast, a target cell can be assigned to the second bin if the target cell is determined to be adjacent to a pair of adjacent cells in which both adjacent cells have an erased state (e.g., logical "1"). The programmed state group defines a pair of group $V_T$ distributions 510A-1 and 510A-2 and the erased state group defines a pair of group $V_T$ distributions 520A-1 and 520A-2. The local media controller can use valley tracking to locate a calibrated read level 530A-1 in the valley between the pair of group $V_T$ distributions 510A-1 and 510A-2, and a calibrated read level 530A-2 in the valley between the pair of group $V_T$ distributions 520A-1 and 520A-2. The local media controller can use the read level 530A-1 to read cells in the programmed state group. The local media controller can use the read level 530A-2 to read cells in the erased state group. Further details regarding dividing the set of target cells into respective bins and using valley tracking to locate the calibrated read levels are described above with reference to FIGS. 1A and 4.

Figure 5B:
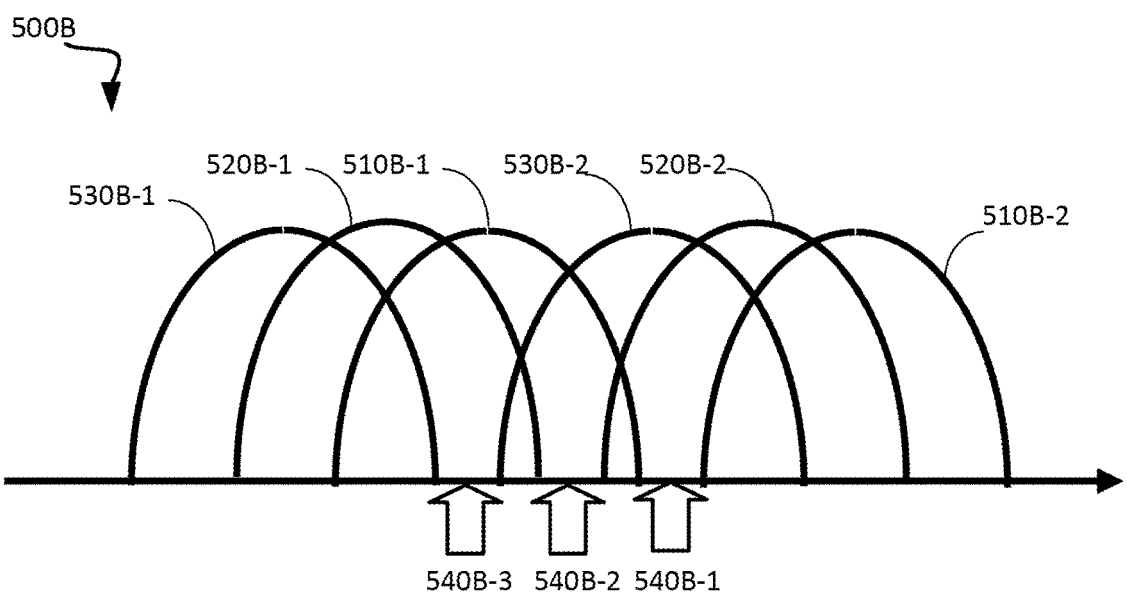

FIG. 5B is a diagram 500B illustrating an example of conditional valley tracking, in accordance with some embodiments of the present disclosure. More specifically, diagram 500B illustrates conditional valley tracking performed utilizing 2-bit information indicative of a state of adjacent cells. A local media controller (e.g., local media controller 135 of FIGS. 1A-1B) can, using the 2-bit information, divide a set of target cells into a programmed state group assigned to a first bin, a non-erased state group assigned to a second bin and an erased state group assigned to a third bin. For example, a target cell can be assigned to the first bin if the target cell is determined to be adjacent to a pair of adjacent cells in which both adjacent cells have a programmed state (e.g., logical "00"). A target cell can be assigned to the second bin if the target cell is determined to be adjacent to a pair of adjacent cells in which one adjacent cell has an erased state and the other adjacent cell has a programmed state (e.g., logical "01" or "10"). A target cell can be assigned to the third bin if the target cell is determined to be adjacent to a pair of adjacent cells in which both adjacent cells have an erased state (e.g., logical "11"). The programmed state group defines a pair of group $V_T$ distributions 510B-1 and 510B-2, the non-erased state group defines a pair of group $V_T$ distributions 520B-1 and 520B-2, and the erased state group defines a pair of group $V_T$ distributions 530B-1 and 530B-2. The local media controller can use valley tracking to locate a calibrated read level 530B-1 in the valley between the pair of group $V_T$ distributions 510B-1 and 510B-2, a calibrated read level 520B-2 in the valley between the pair of group $V_T$ distributions 520B-1 and 520B-2, and a calibrated read level 530B-2 in the valley between the pair of group $V_T$ distributions 530B-1 and 530B-2. The local media controller can use the read level 530B-1 to read cells in the programmed state group. The local media controller can use the read level 530B-2 to read cells in the non-erased state group. The local media controller can use the read level 530B-3 to read cells in the erased state group. Further details regarding dividing the set of target cells into respective bins and using valley tracking to locate the calibrated read levels are described above with reference to FIGS. 1A and 4.

Figure 6:
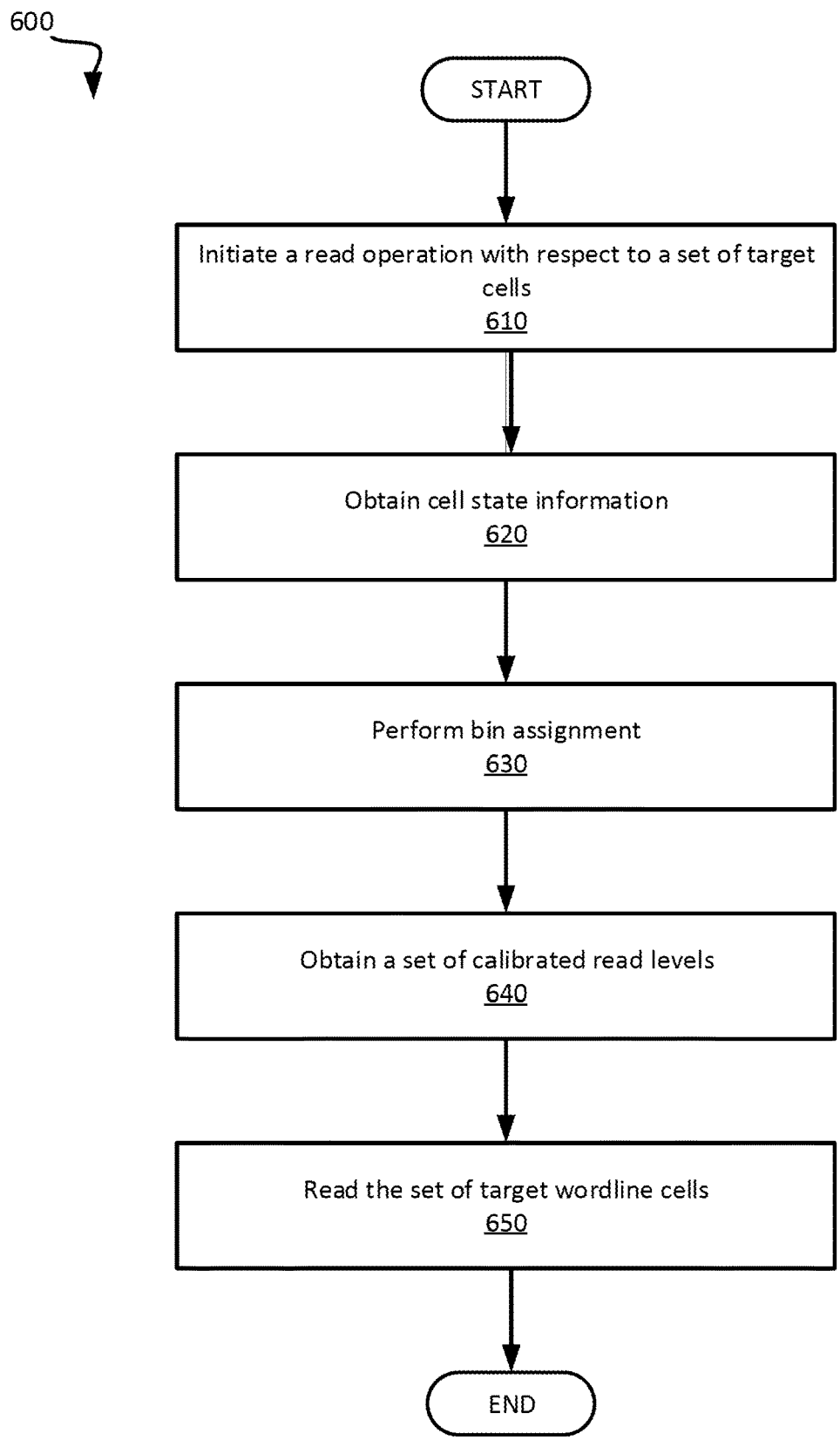
FIG. 6 is a flow diagram of an example method to perform conditional valley tracking during a corrective read, in accordance with some embodiments of the present disclosure.

FIG. 6 is a flow diagram of an example method 600 to implement conditional valley tracking during corrective reads, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the CR component 137 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a read operation is initiated with respect to a set of target cells. For example, processing logic can cause the corrective read to be initiated with respect to the set of target cells in response to receiving a request to perform corrective read. The request can be a read command received via a memory sub-system controller (e.g., the memory sub-system controller 115 of FIGS. 1A-1B). Each target cell of the set of target cells is connected to a target wordline.

At operation 620, cell state information is obtained. For example, the processing logic can cause cell state information to be obtained from respective groups of adjacent cells. Each group of adjacent cells includes at least one cell adjacent to a respective target cell of the set of target cells. Each cell is connected to a respective wordline adjacent to the target wordline. Illustratively, each cell of a group of adjacent cells can be directly above or directly below its respective target cell. Obtaining the cell state information can further include storing the cell state information for each group of adjacent cells in a respective page buffer connected to the pair of adjacent cells via a bitline.

In some embodiments, the information includes 1-bit information. For example, 1-bit information for a pair of adjacent cells can be indicative of at least one adjacent cell of the pair of adjacent cells having a programmed state (e.g., logical "0"). As another example, the 1-bit information for a pair of adjacent cells can be indicative of both of the adjacent cells having an erased state (e.g., logical "1").

In some embodiments, the information includes 2-bit information stored in respective 2-bit registers. For example, the 2-bit information for a pair of adjacent cells can be indicative of both of the adjacent cells having a programmed state (e.g., logical "00"). As another example, the 2-bit information for a pair of adjacent cells can be indicative of one of the adjacent cells having a programmed state and the other of the adjacent cells having an erased state (e.g., logical "01" or "10"). As yet another example, the 2-bit information for a pair of adjacent cells can be indicative of both of the adjacent cells having an erased state (e.g., logical "00").

At operation 630, a state information bin ("bin") assignment is performed. For example, the processing logic can, for each target cell of the set of target cells, assign the target cell to a respective bin based on the cell state information. Each bin defines a respective cell state information condition, and a target cell is assigned to a bin if the cell(s) within its respective group of adjacent cells satisfy the cell state information condition for the bin. Thus, the bins divide the $V_T$ distribution defined by the set of target cells into a number of respective group $V_T$ distributions, where each group $V_T$ distribution is defined by a group target cells assigned to a respective bin.

For example, in the 1-bit information embodiments, a target cell can be assigned to a programmed state bin if the target cell is connected to a page buffer storing 1-bit information indicating that the target cell is adjacent to a group of adjacent cells in which at least one cell has a programmed state (e.g., logical "0"). In contrast, a target cell can be assigned to an erased state bin if the target cell is connected to a page buffer storing 1-bit information indicating that the target cell is adjacent to a group of adjacent cells in which each adjacent cell has an erased state (e.g., logical "1"). The target cells assigned to the programmed state bin can be referred to as a "programmed state group" and the target cells assigned to the erased state bin can be referred to as an "erased state group."

As another example, in the 2-bit information embodiments, a target cell can be assigned to a programmed state bin if the target cell is connected to a page buffer storing 2-bit information indicating that the target cell is adjacent to a pair of adjacent cells in which both cells have a programmed state (e.g., logical "00"). A target cell can be assigned to a non-erased state bin if the target cell is connected to a page buffer storing 2-bit information indicating that the target cell is adjacent to a pair of adjacent cells in which one cell has a programmed state and another cell has an erased state (e.g., logical "01" or logical "10"). A target cell can be assigned to an erased state bin if the target cell is connected to a page buffer storing 2-bit information indicating that the target cell is adjacent to a pair of adjacent cells in which both cells have an erased state (e.g., logical "11"). The target cells assigned to the programmed state bin can be referred to as a "programmed state group," the target cells assigned to the erased state bin can be referred to as an "erased state group," and the target cells assigned to the non-erased state bin can be referred to as a "non-erased state group."

At operation 640, a set of calibrated read level offsets is obtained. For example, the processing logic can for, each bin, obtain a calibrated read level offset for reading the group of target cells assigned to the bin. More specifically, the processing logic can, for each group of target cells, use valley tracking to locate a respective calibrated read level offset within a valley between its respective pair of group $V_T$ distributions. The calibrated read level offsets collectively form a set of calibrated read level offsets. For example, in the 1-bit information embodiments, the programmed state group assigned to the program state bin and the erased state group assigned to the erased state bin can each define a respective pair of group $V_T$ distributions. Another example, in the 2-bit information embodiments, the programmed state group assigned to the program state bin, the non-erased state group assigned to the non-erased state bin and the erased state group assigned to the erased state bin can each define a respective pair of group $V_T$ distributions.

For example, using valley tracking to locate a calibrated read level offset can include identifying a set of sample voltages about a chosen read level. For each sample voltage of the set of sample voltages, the processing logic can obtain a cell count by counting a number of cells of the group of target cells that have a threshold voltage lower than the sample voltage. The processing logic can then generate a model using the cell count (e.g., a histogram). The processing logic can then identify the calibrated read level from the model.

At operation 650, the set of target cells is read. For example, the processing logic can cause each group of target cells to be read with a respective calibrated read level offset of the set of calibrated read level offsets. Reading each group of target cells using the respective calibrated read level offset can lead to reduced error rates and improved memory device performance. Further details regarding operations 610-650 are described above with reference to FIGS. 1A and 4-5B.

Figure 7:
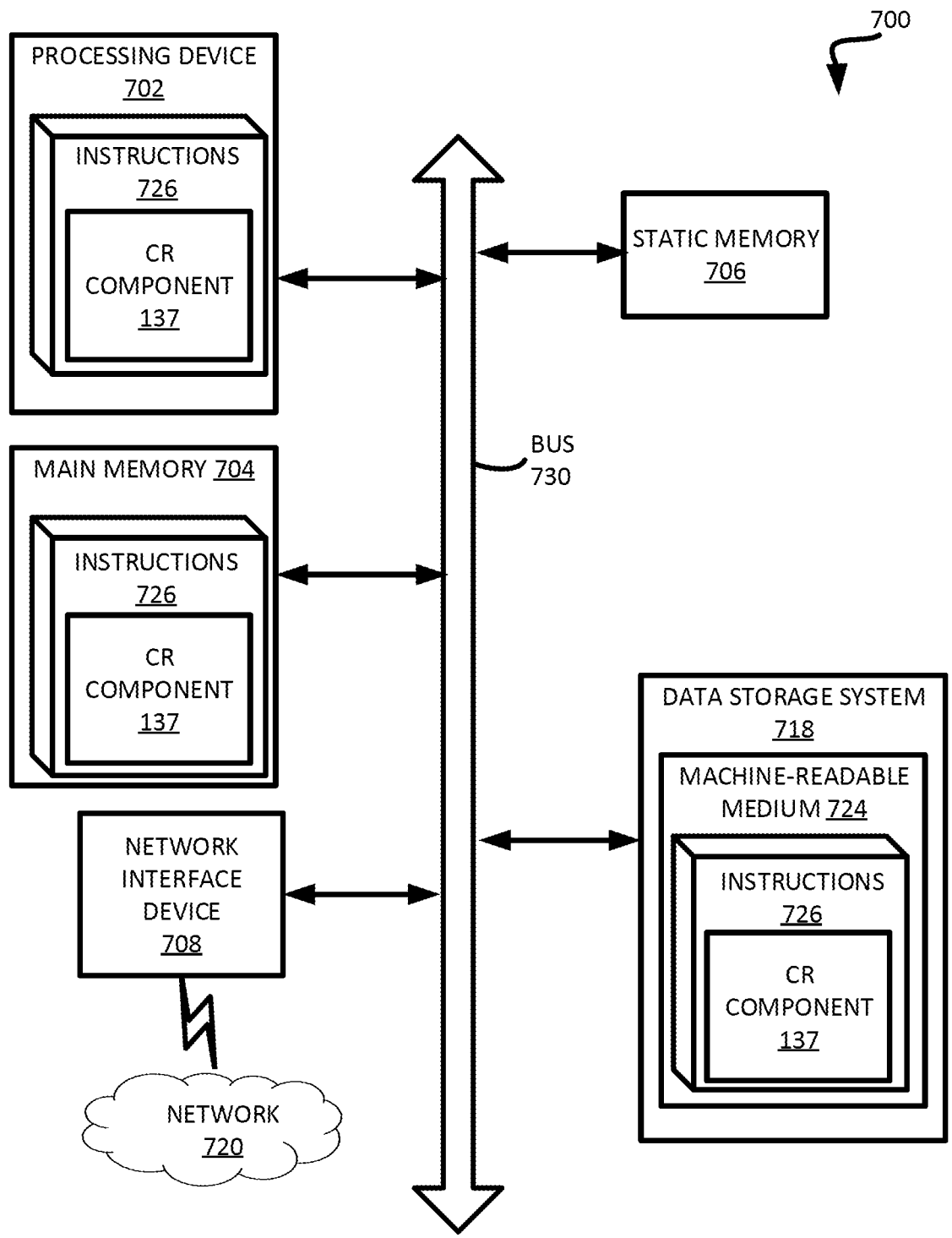
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the CR component 137 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 602 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a CR component (e.g., the CR component 137 of FIG. 1A). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising:
      a set of target cells connected to a target wordline;
      at least one wordline adjacent to the target wordline; and
      for each target cell of the set of target cells, a respective group of adjacent cells adjacent to the target cell, wherein each group of adjacent cells comprises at least one cell connected to the at least one wordline; and control logic, operatively coupled with the memory array, to perform operations comprising:
  causing a read operation to be initiated with respect to the set of target cells;
  obtaining, for each group of adjacent cells, respective cell state information;
  assigning, based on the respective cell state information, each target cell of the set of target cells to a respective state information bin of a set of state information bins, wherein each state information bin is associated with a respective group of target cells of the set of target cells; and
  determining a set of calibrated read level offsets, wherein each calibrated read level offset of the set of calibrated read level offsets is associated with a respective state information bin of the set of state information bins.

2. The memory device of claim 1, wherein:
the set of target cells defines a threshold voltage distribution; and
each group of target cells defines a respective pair of group threshold voltage distributions.

3. The memory device of claim 2, wherein determining the set of calibrated read level offsets comprises using valley tracking to locate each calibrated read level offset of the set of calibrated read level offsets in a valley between the respective pair of group threshold voltage distributions defined by its respective group of target cells.

4. The memory device of claim 3, wherein using valley tracking to determine each calibrated read level offset of the set of calibrated read level offsets comprises:
  identifying a set of sample voltages about a chosen read level;
  for each sample voltage of the set of sample voltages, obtaining a cell count by counting a number of cells of the respective group of target cells that have a threshold voltage lower than the sample voltage;
  generating a model using each cell count; and
  identifying the calibrated read level from the model.

5. The memory device of claim 1, wherein:
the set of state information bins comprises a programmed state bin and an erased state bin;
each target cell assigned to the programmed state bin corresponds to a programmed state group of target cells, each target cell of the programmed state group being adjacent to a respective pair of adjacent cells comprising at least one cell having a programmed state; and
each target cell assigned to the erased state bin corresponds to an erased state group of target cells, each target cell of the erased state group being adjacent to a respective pair of adjacent cells each having an erased state.

6. The memory device of claim 1, wherein:
the set of state information bins comprises a programmed state bin, a non-erased state bin and an erased state bin;
each target cell assigned to the programmed state bin corresponds to a programmed state group of target cells, each target cell of the programmed state group being adjacent to a respective pair of adjacent cells comprising at least one cell having a programmed state;
each target cell assigned to the non-erased state bin corresponds to a non-erased state group of target cells, each target cell of the erased state group being adjacent to a respective pair of adjacent cells comprising one cell having a programmed state and one cell having an erased state; and
each target cell assigned to the erased state bin corresponds to an erased state group of target cells, each target cell of the erased state group being adjacent to a respective pair of adjacent cells each having an erased state.

7. The memory device of claim 1, wherein the operations further comprise each group of target cells to be read using its respective calibrated read level offset.

8. A method comprising:
  causing, by a processing device, a read operation to be initiated with respect to a set of target cells connected to a target wordline of a memory device, wherein the target wordline is adjacent to at least one wordline, wherein, for each target cell of the set of target cells, a respective group of adjacent cells is adjacent to the target cell, and wherein each group of adjacent cells comprises at least one cell connected to the at least one wordline;
  obtaining, by the processing device for each group of adjacent cells, respective cell state information;
  assigning, by the processing device based on the respective cell state information, each target cell of the set of target cells to a respective state information bin, wherein each state information bin is associated with a respective group of target cells of the set of target cells; and
  determining, by the processing device, a set of calibrated read level offsets, wherein each calibrated read level offset of the set of calibrated read level offsets is associated with a respective state information bin of the set of state information bins.

9. The method of claim 8, wherein:
the set of target cells defines a threshold voltage distribution; and
each group of target cells defines a respective pair of group threshold voltage distributions.

10. The method of claim 9, wherein determining the set of calibrated read level offsets comprises using valley tracking to locate each calibrated read level offset of the set of calibrated read level offsets in a valley between the respective pair of group threshold voltage distributions defined by its respective group of target cells.

11. The method of claim 10, wherein using valley tracking to determine each calibrated read level offset of the set of calibrated read level offsets comprises:
  identifying a set of sample voltages about a chosen read level;
  for each sample voltage of the set of sample voltages, obtaining a cell count by counting a number of cells of the respective group of target cells that have a threshold voltage lower than the sample voltage;
  generating a model using each cell count; and
  identifying the calibrated read level from the model.

12. The method of claim 8, wherein:
the set of state information bins comprises a programmed state bin and an erased state bin;
each target cell assigned to the programmed state bin corresponds to a programmed state group of target cells, each target cell of the programmed state group being adjacent to a respective pair of adjacent cells comprising at least one cell having a programmed state; and
each target cell assigned to the erased state bin corresponds to an erased state group of target cells, each target cell of the erased state group being adjacent to a respective pair of adjacent cells each having an erased state.

13. The method of claim 8, wherein:
the set of state information bins comprises a programmed state bin, a non-erased state bin and an erased state bin;
each target cell assigned to the programmed state bin corresponds to a programmed state group of target cells, each target cell of the programmed state group being adjacent to a respective pair of adjacent cells comprising at least one cell having a programmed state;
each target cell assigned to the non-erased state bin corresponds to a non-erased state group of target cells, each target cell of the erased state group being adjacent to a respective pair of adjacent cells comprising one cell having a programmed state and one cell having an erased state; and
each target cell assigned to the erased state bin corresponds to an erased state group of target cells, each target cell of the erased state group being adjacent to a respective pair of adjacent cells each having an erased state.

14. The method of claim 8, further comprising causing, by the processing device, each group of target cells to be read using its respective calibrated read level offset.

15. A non-transitory computer-readable storage medium comprising instructions that, when executed by a processing device, cause the processing device to perform operations comprising:
obtaining, for each group of adjacent cells of a memory device, respective cell state information, wherein each group of adjacent cells comprises at least one cell adjacent to a target cell of a set of target cells connected to a target wordline, and wherein the at least one cell is connected to an adjacent wordline adjacent to the target wordline;
assigning, based on the respective cell state information, each target cell of the set of target cells to a respective state information bin of a set of state information bins, wherein each state information bin is associated with a respective group of target cells of the set of target cells;
determining a set of calibrated read level offsets, wherein each calibrated read level offset of the set of calibrated read level offsets is associated with a respective state information bin of the set of state information bins; and
causing, by the processing device, each group of target cells to be read using its respective calibrated read level offset.

16. The non-transitory computer-readable storage medium of claim 15, wherein:
the set of target cells defines a threshold voltage distribution; and
each group of target cells defines a respective pair of group threshold voltage distributions.

17. The non-transitory computer-readable storage medium of claim 16, wherein determining the set of calibrated read level offsets comprises using valley tracking to locate each calibrated read level offset of the set of calibrated read level offsets in a valley between the respective pair of group threshold voltage distributions defined by its respective group of target cells.

18. The non-transitory computer-readable storage medium of claim 17, wherein using valley tracking to determine each calibrated read level offset of the set of calibrated read level offsets comprises:
identifying a set of sample voltages about a chosen read level;
for each sample voltage of the set of sample voltages, obtaining a cell count by counting a number of cells of the respective group of target cells that have a threshold voltage lower than the sample voltage;
generating a model using each cell count; and
identifying the calibrated read level from the model.

19. The non-transitory computer-readable storage medium of claim 15, wherein:
the set of state information bins comprises a programmed state bin and an erased state bin;
each target cell assigned to the programmed state bin corresponds to a programmed state group of target cells, each target cell of the programmed state group being adjacent to a respective pair of adjacent cells comprising at least one cell having a programmed state; and
each target cell assigned to the erased state bin corresponds to an erased state group of target cells, each target cell of the erased state group being adjacent to a respective pair of adjacent cells each having an erased state.

20. The non-transitory computer-readable storage medium of claim 15, wherein:
the set of state information bins comprises a programmed state bin, a non-erased state bin and an erased state bin;
each target cell assigned to the programmed state bin corresponds to a programmed state group of target cells, each target cell of the programmed state group being adjacent to a respective pair of adjacent cells comprising at least one cell having a programmed state;
each target cell assigned to the non-erased state bin corresponds to a non-erased state group of target cells, each target cell of the erased state group being adjacent to a respective pair of adjacent cells comprising one cell having a programmed state and one cell having an erased state; and
each target cell assigned to the erased state bin corresponds to an erased state group of target cells, each target cell of the erased state group being adjacent to a respective pair of adjacent cells each having an erased state.

* * * * *